(12) United States Patent
Prasad

(10) Patent No.: US 10,587,235 B2
(45) Date of Patent: Mar. 10, 2020

(54) BIASED AMPLIFIER

(71) Applicant: TEXAS INSTRUMENTS INCORPORATED, Dallas, TX (US)

(72) Inventor: Sudheer Prasad, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/912,477

(22) Filed: Mar. 5, 2018

(65) Prior Publication Data
US 2019/0115885 A1  Apr. 18, 2019

(30) Foreign Application Priority Data

Oct. 16, 2017 (IN) .............................. 201741036697

(51) Int. Cl.
H03F 3/45 (2006.01)
H03K 3/01 (2006.01)

(52) U.S. Cl.
CPC ..... *H03F 3/45502* (2013.01); *H03F 3/45085* (2013.01); *H03F 3/45089* (2013.01); *H03F 3/45165* (2013.01); *H03F 3/45264* (2013.01); *H03F 3/45461* (2013.01); *H03F 2200/12* (2013.01); *H03F 2203/45342* (2013.01); *H03F 2203/45354* (2013.01); *H03F 2203/45392* (2013.01)

(58) Field of Classification Search
USPC ................................................. 330/252–261
See application file for complete search history.

(56) References Cited

U.S. PATENT DOCUMENTS

| 5,608,344 A * | 3/1997 | Marlow | H03K 3/0377 327/206 |
| 7,714,652 B2 * | 5/2010 | Mangudi | G05F 3/205 327/534 |

OTHER PUBLICATIONS

CUI Inc., "Electret Condenser Microphone," 4 p. [Online] www.cui.com/product/resource/cma-6542pf.pdf.

* cited by examiner

Primary Examiner — Hieu P Nguyen
(74) Attorney, Agent, or Firm — Brian D. Graham; Charles A. Brill; Frank D. Cimino

(57) ABSTRACT

In one example an amplifier includes a bias circuit, an open-loop gain stage including a first PMOS having a gate coupled to a first node, a source coupled to a second node, a drain coupled to a third node, and a bulk coupled to the bias circuit, a second PMOS having a gate coupled to a ground node, a source coupled to the second node, a drain coupled to a fourth node, and a bulk coupled to the bias circuit, a first NMOS having a drain and a gate coupled to the third node and a source coupled to a fifth node, a second NMOS having a drain coupled to the fourth node, a gate coupled to the third node, and a source coupled to the fifth node, an adjustable resistor coupleable between the third and fourth nodes, and a buffer stage coupled to the open-loop gain stage.

20 Claims, 4 Drawing Sheets

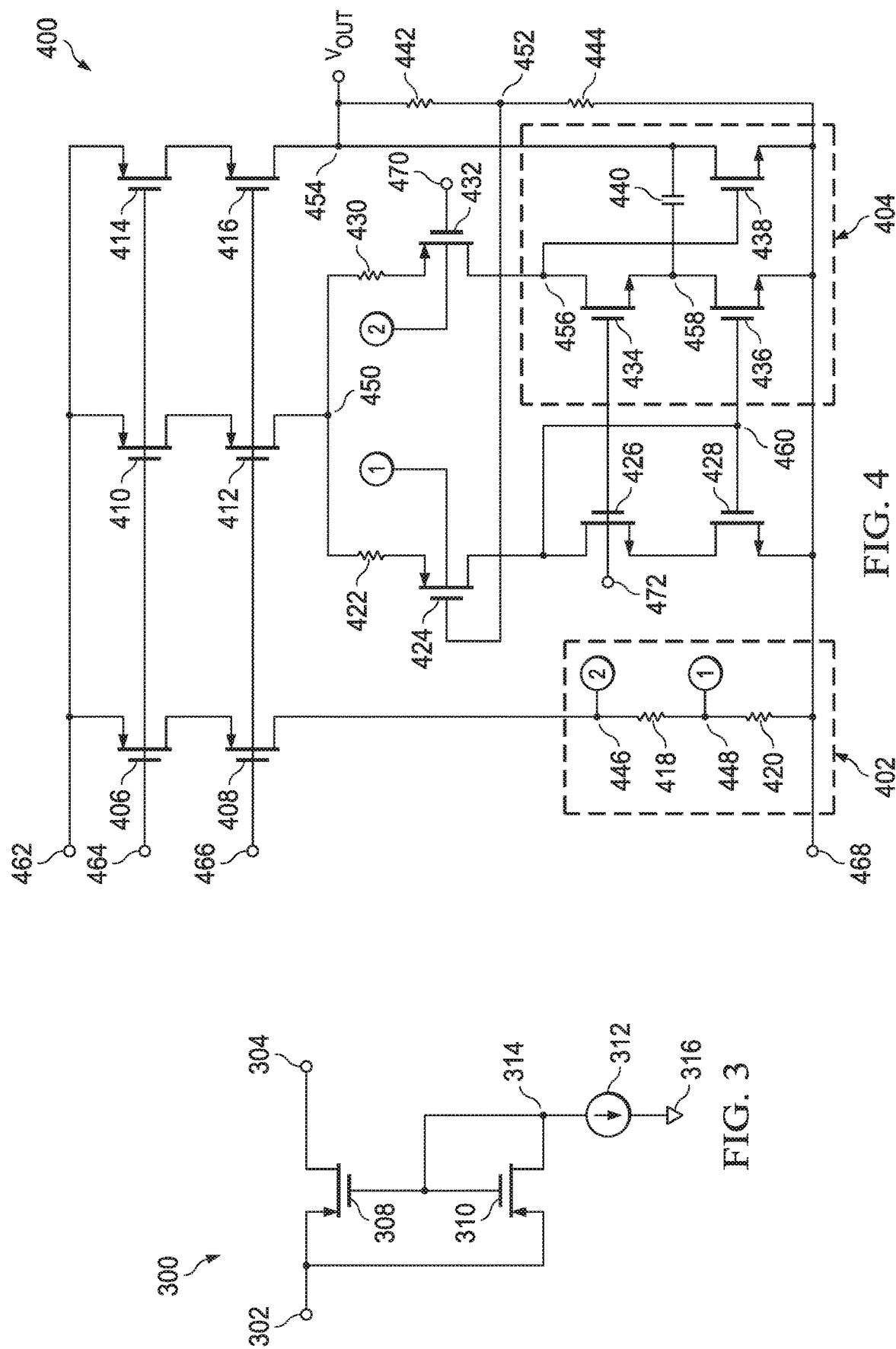

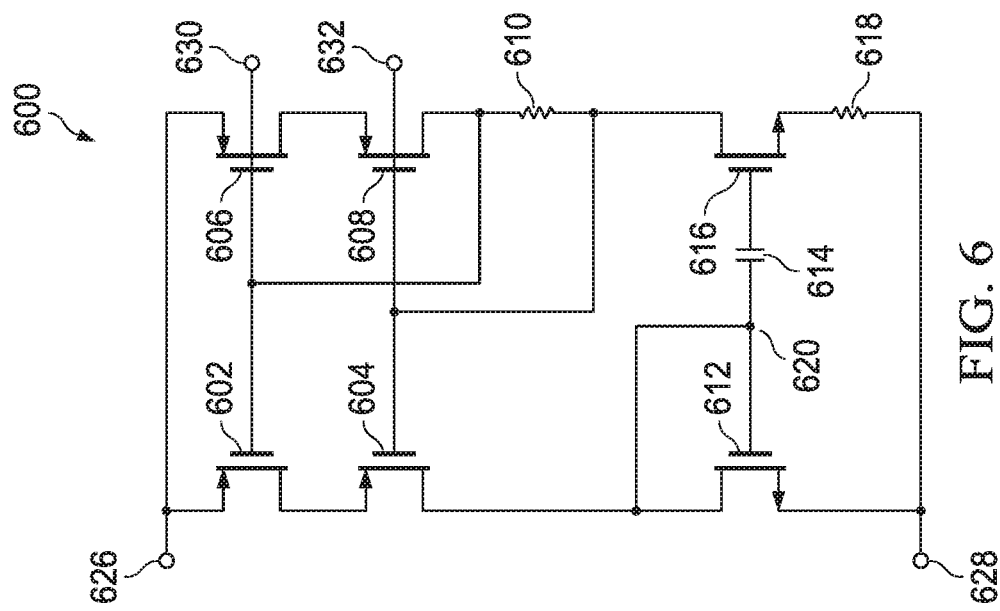
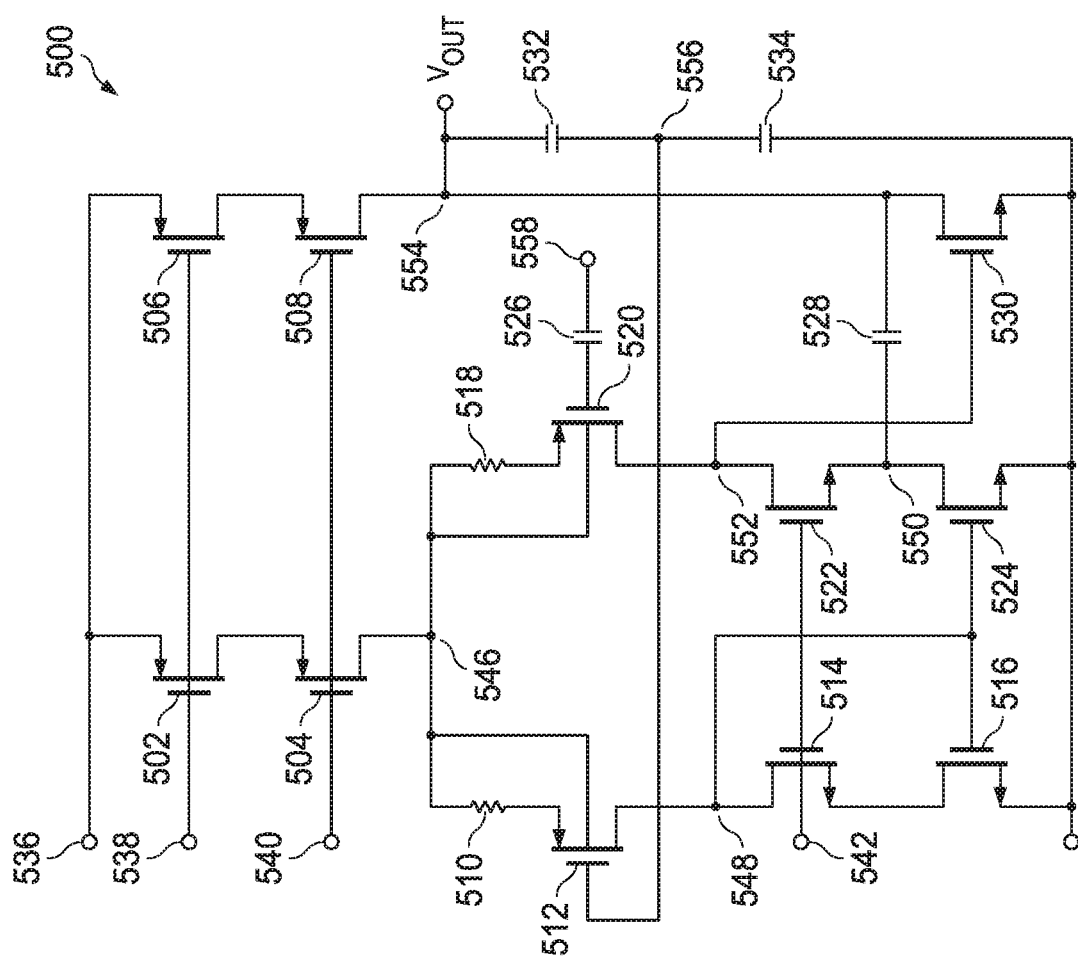

BIASED AMPLIFIER

CROSS-REFERENCE TO RELATED APPLICATIONS

The present application claims the benefit of and priority to Indian Provisional Patent Application No. 201741036697, which was filed Oct. 16, 2017, is titled "Low Power Techniques for Sensing Capacitive Transducers," and is hereby incorporated herein by reference in its entirety.

SUMMARY

According to aspects of the disclosure, an amplifier includes a bias circuit, an open-loop gain stage, and a buffer stage. The bias circuit is configured to generate a bias voltage with respect to ground. The open-loop gain stage includes a first p-type metal oxide semiconductor field effect transistor (MOSFET) (PMOS) having a gate terminal coupled to a first node, a source terminal coupled to a second node, a drain terminal coupled to a third node, and a bulk connection coupled to the bias circuit, a second PMOS having a gate terminal coupled to a ground node, a source terminal coupled to the second node, a drain terminal coupled to a fourth node, and a bulk connection coupled to the bias circuit, a first n-type MOSFET (NMOS) having a drain terminal and a gate terminal coupled to the third node and a source terminal coupled to a fifth node, and a second NMOS having a drain terminal coupled to the fourth node, a gate terminal coupled to the third node; and a source terminal coupled to the fifth node, wherein the gain stage is configured to couple to an adjustable resistor positioned between the third node and the fourth node. The buffer stage is coupled to the open-loop gain stage at the fourth node and includes a super source follower.

In other aspects of the disclosure, an amplifier includes a bias circuit and a buffer stage. The buffer stage is coupled to the bias circuit and includes a first PMOS having a source terminal coupled to a second node; a gate terminal coupled to a third node, a drain terminal coupled to a fourth node, and a bulk connection coupled to a first node, a first resistor coupleable between the first node and the second node, a first NMOS having a drain terminal coupled to the fourth node, a gate terminal coupled to the bias circuit, and a source terminal configured to couple to a fifth node via a second resistor, a second NMOS having a drain terminal coupled to the second node, a gate terminal coupled to the fourth node, and a source terminal coupled to the fifth node, wherein the buffer stage is configured to couple to a first capacitor and a third resistor coupled in series between the fourth node and the fifth node, and wherein the second node is an output of the amplifier.

In other aspects of the disclosure, an amplifier includes a bias circuit, a compensation circuit, a first PMOS having a source terminal coupled to a first node, a gate terminal coupled to a second node, a drain terminal coupled to a fourth node, and a bulk connection coupled to the bias circuit, a second PMOS having a source terminal coupled to the first node, a gate terminal coupled to a third node, a drain terminal coupled to the compensation circuit at a fifth node, and a bulk connection coupled to the bias circuit, a first NMOS having a drain terminal coupled to the fourth node and a gate terminal coupled to a sixth node, and a second NMOS having a drain terminal coupled to a source terminal of the first NMOS, a gate terminal coupled to the fourth node, and a source terminal coupled to a seventh node.

In other aspects of the disclosure, an amplifier includes a first PMOS having a source terminal configured to couple to a first node via a first resistor, a gate terminal coupled to a second node, and a drain terminal coupled to a third node, a second PMOS having a source terminal configured to couple to the first node via a second resistor, a gate terminal configured to couple to a fourth node via a first capacitor, and a drain terminal coupled to a fifth node, a first NMOS having a drain terminal coupled to the third node and a gate terminal coupled to a sixth node, a second NMOS having a drain terminal coupled to a source terminal of the first NMOS, a gate terminal coupled to the third node, and a source terminal coupled to a seventh node, a third NMOS having a gate terminal coupled to the sixth node, a drain terminal coupled to the fifth node, and a source terminal coupled to an eighth node, a fourth NMOS having a gate terminal coupled to the third node, a drain terminal coupled to the eighth node, and a source terminal coupled to the seventh node, and a fifth NMOS having a gate terminal coupled to the fifth node, a drain terminal coupled to a ninth node, and a source terminal coupled to the seventh node, wherein the amplifier is configure to couple to a second capacitor positioned between the eighth node and the ninth node, a third capacitor positioned between the ninth node and the second node, and a fourth capacitor positioned between the second node and the seventh node.

BRIEF DESCRIPTION OF THE DRAWINGS

For a detailed description of various examples, reference will now be made to the accompanying drawings in which:

FIG. 3 shows a schematic diagram of an illustrative large impedance metal oxide semiconductor field effect transistor (MOSFET) circuit;

FIG. 4 shows a schematic diagram of an illustrative amplifier;

FIG. 5 shows a schematic diagram of an illustrative amplifier; and

FIG. 6 shows a schematic diagram of an illustrative bias generation circuit.

DETAILED DESCRIPTION

At least some electrical devices operate as capacitive sensors (e.g., capacitive transducers) in which an output of the sensor is represented as a capacitive value that changes as an input (e.g., a measured quantity or value) of the electrical devices changes. Such electrical devices include, for example, audio microphones (such as electret microphones, microelectro-mechanical systems (MEMS) microphones, etc.), pressure sensors, proximity sensors, touch sensors, displacement sensors, liquid level sensors, as well as numerous other capacitive-based sensors. At least some examples in this category of capacitance-based sensors include amplifying and/or buffering circuitry, for example, to mitigate noise of a signal output by the capacitance-based sensors. The noise is, for example, at least partially caused by a high output impedance of the capacitance-based sensor and/or electrical signal noise coupled from a nearby signal or from the power supply. At least some examples of the capacitance-based sensors are implemented in low-power applications such that power available for the amplifying and/or buffering circuitry is limited.

At least some aspects of the present disclosure provide for a capacitance-based sensor. In at least one example, the amplifier includes amplifying and/or buffering circuitry that amplifies an output of the sensor and buffers the amplified signal to provide a low-impedance output while drawing a minimal amount of current to satisfy the low power availability, discussed above. In at least one example, the amplifier draws a current of less than about 30 micro-amps (μA). In another example, the amplifier draws a current of less than about 25 μA. In at least some examples, the amplifier includes back bias generation for biasing at least a portion of the amplifying and/or buffering circuitry. The back bias generation, in at least one example, compensates for a lack of (e.g., approximately zero) common-mode voltage received by the amplifier from the capacitance-based sensor. In at least one example, the amplifier further includes a large impedance circuit for creating giga-ohm (GΩ) level impedances. In at least one example, the amplifier further includes capacitors implemented according to analog floating gate (AFG) technology.

Figure 1:
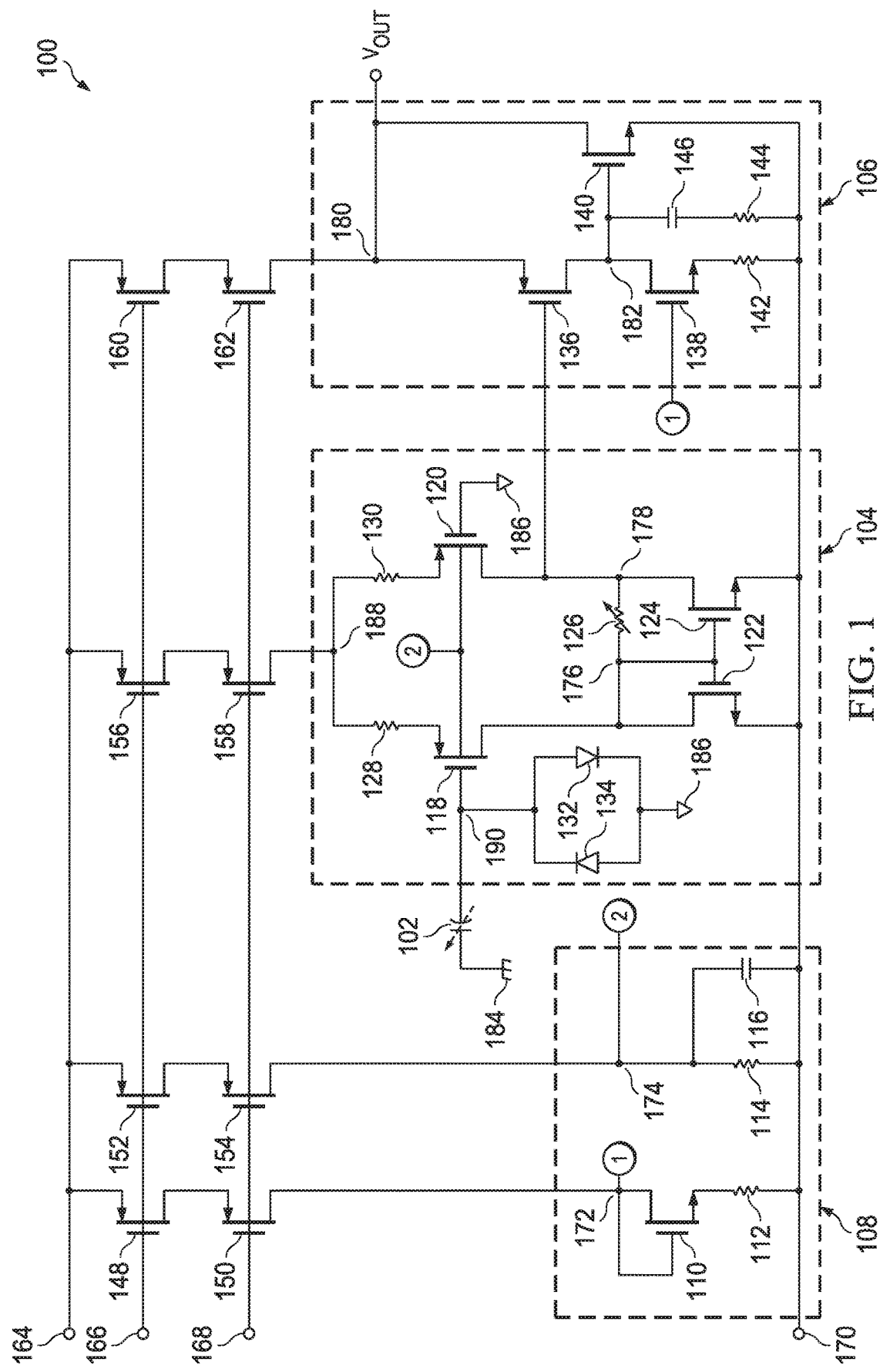
FIG. 1 shows a schematic diagram of an illustrative amplifier.

Turning now to FIG. 1, a schematic diagram of an illustrative amplifier 100 is shown. The amplifier 100 is, for example, an open-loop, two-stage amplifier. For example, the amplifier 100 does not include a feedback path where an output ($V_{OUT}$) of the amplifier 100 is fed back through the amplifier 100 and is therefore referred to as open-loop. Additionally, in at least one example, the amplifier 100 includes a gain stage 104 and a buffer stage 106 and is therefore referred to as two-stage. In at least one example, the amplifier 100 is suitable for implementation to amplify and/or buffer an output of a capacitance-based sensor. For example, the amplifier 100 is configured to couple to a sensor 102 and amplify and/or buffer an output of the sensor 102 for output by the amplifier 100 as $V_{OUT}$. The sensor 102 is any capacitance-based sensor, as discussed above. In at least one example, the sensor 102 is coupled between the amplifier 100 and a chassis ground 184 (which in some examples is coupled to an Earth ground (not shown) or node 170). In at least some examples, the amplifier 100 is further configured to couple to a controller (not shown) or other processing element that provides one or more control signals (e.g., transistor gate control signals, potentiometer control signals, etc.) to the amplifier 100.

In at least one example, the amplifier 100 includes a bias circuit 108 that includes a metal oxide semiconductor field effect transistor (MOSFET), such as a n-type MOSFET (NMOS) 110. In at least one example, the bias circuit 108 further includes, or is configured to couple to, a resistor 112, a resistor 114, and a capacitor 116. In at least one example, the gain stage 104 includes a p-type MOSFET (PMOS) 118, a PMOS 120, a NMOS 122, and a NMOS 124. The gain stage 104 further includes, or is configured to couple to, an impedance element 126, a resistor 128, a resistor 130, a diode 132, and a diode 134. In at least one example, the buffer stage 106 includes a PMOS 136, a NMOS 138, and a NMOS 140. The buffer stage 106 further includes, or is configured to couple to, a resistor 142, a resistor 144, and a capacitor 146. In at least one example, the amplifier 100 further includes PMOS 148, PMOS 150, PMOS 152, PMOS 154, PMOS 156, PMOS 158, PMOS 160, and PMOS 162.

In at least one example, the amplifier 100 is configured to receive a plurality of voltage signals. For example, the amplifier 100 receives a positive source supply voltage (VDD) at a node 164, a PMOS bias voltage (VBP) at a node 166, a cascode bias voltage (VCASP) at a node 168, and a negative source supply voltage (VSS) at a node 170. In various examples, the voltage signals are received from any one or more suitable sources such as, for example, a controller or other processing element coupled to the amplifier 100, a power source coupled to the amplifier 100, and/or a reference circuit included within, or coupled to, the amplifier 100. In at least one example, VSS represents a ground (e.g., Earth ground) such that node 170 is referred to as a ground node.

In at least one example, each of the PMOS 148, 152, 156, and 160 are coupled at respective source terminals to the node 164 and at respective gate terminals to the node 166. In at least one example, the PMOS 150, 154, 158, and 162 are each coupled at respective gate terminals to the node 168. In at least one example, a drain terminal of the PMOS 148 is coupled to a source terminal of the PMOS 150, a drain terminal of the PMOS 152 is coupled to a source terminal of the PMOS 154, a drain terminal of the PMOS 156 is coupled to a source terminal of the PMOS 158, and a drain terminal of the PMOS 160 is coupled to a source terminal of the PMOS 162. In at least one example, a drain terminal of the PMOS 150 is coupled to a node 172, a drain terminal of the PMOS 154 is coupled to a node 174, a drain terminal of the PMOS 158 is coupled to a node 188, and a drain terminal of the PMOS 162 is coupled to a node 180.

In at least one example, a drain terminal and a gate terminal of the NMOS 110 are coupled to the node 172 and the resistor 112 is coupleable between the source terminal of the NMOS 110 and the node 170. In at least one example, the resistor 114 and the capacitor 116 are coupleable between the node 174 and the node 170. In at least one example, the resistor 128 is coupleable between the node 188 and a source terminal of the PMOS 118 and the resistor 130 is coupleable between the node 188 and a source terminal of the PMOS 120. In at least one example, bulk connections of the PMOS 118 and the PMOS 120 are coupled to the node 174. In at least one example, a drain terminal of the PMOS 118 is coupled to a node 176, a gate terminal of the PMOS 118 is coupled to a node 190, a drain terminal of the PMOS 120 is coupled to node 178, and a gate terminal of the PMOS 120 is coupled to a digital (or common) ground node 186. In at least one example, the diodes 132 and 134 are coupled between the node 190 and the node 186 in opposite polarities with respect to each other. In at least one example, the amplifier 100 is configured to couple to the sensor 102 at the node 190.

In at least one example, a drain and gate terminal of the NMOS 122 is coupled to the node 176 and a source terminal of the NMOS 122 is coupled to the node 170. In at least one example, the impedance element 126 is coupleable between the node 176 and the node 178. In at least one example, the impedance element 126 is further coupleable to a controller or other processing element (not shown) configured to control an amount of impedance of the impedance element 126. In at least one example, a gate terminal of the NMOS 124 is coupled to the node 176, a source terminal of the NMOS 124 is coupled to the node 170, and a drain terminal of the NMOS 124 is coupled to the node 178. In at least one example, a gate terminal of the PMOS 136 is coupled to the node 178, a source terminal of the PMOS 136 is coupled to the node 180, and a drain terminal of the PMOS 136 is coupled to the node 182. In at least one example, a gate terminal of the NMOS 138 is coupled to the node 172, a drain terminal of the NMOS 138 is coupled to the node 182, and a source terminal of the NMOS 138 is coupleable to ground though the resistor 142. In at least one example, a gate terminal of the NMOS 140 is coupled to the node 182, a drain terminal of the NMOS 140 is coupled to the node 180, and a source terminal of the NMOS 140 is coupled to the node 170. In at least one example, a first terminal of the capacitor 146 is coupled to the node 182, a second terminal of the capacitor 146 is coupled to a first terminal of the resistor 144, and a second terminal of the resistor 144 is coupled to the node 170. In at least one example, $V_{OUT}$ of the amplifier 100 is taken at node 180.

In at least one example of operation, the amplifier 100 is configured to amplify and buffer a signal received from the sensor 102 (e.g., such that the node 190 is referred to as an input of the amplifier 100). In at least one example, a gain of the amplifier 100 (e.g., an amount of amplification provided by the amplifier 100 to the signal received from the sensor 102) is determined according to a transconductance of the PMOS 118 multiplied by an impedance of the impedance element 126. In at least one example, an amount of impedance of the impedance element 126 is configurable (e.g., based on a control signal received from an external controller). In various examples, the impedance element 126 comprises any one or more of a digitally-controllable resistance, a potentiometer, a resistor, a plurality of resistors, or any other element or combination of elements that provide for the selection and variation of an amount of impedance presented in the amplifier 100 by the impedance element 126.

In at least one example, the PMOS 118 and the PMOS 120 are biased by a back bias voltage through the coupling of the bulk connection of PMOS 118 and the PMOS 120 to the node 174. The back bias voltage is, for example a bias voltage based at least partially on VDD and determined with respect to ground. Biasing the PMOS 118 and the PMOS 120, in some examples, increases a gate to source voltage differential of the PMOS 118 and the PMOS 120. In at least one example, biasing the PMOS 118 and the PMOS 120 further enables operation of the amplifier 100 (e.g., such as the gain stage 104) with the signal received from the sensor 102 including minimal, or no, common-mode voltage component by increasing gate to source threshold voltages of the PMOS 118 and the PMOS 120 above that of the NMOS 122 and the NMOS 124. In at least one example, the bias circuit 108 generates the back bias voltage present at node 174 and a NMOS bias voltage (VBN) present at a node 172, for example, based at least partially on a value of resistance of the resistors 114 and 112, respectively.

In at least one example, the resistor 128 is a linearizing resistor that reduces input harmonic distortion (e.g., total harmonic distortion (THD)) of the amplifier 100. A direct current (DC) operating point of the amplifier 100 is set to about zero, in at least one example, via leakage of the diode 132 and the diode 134. In at least one example, the diode 132 and the diode 134 further mitigate at least some effects of electrostatic discharge (ESD). The gain stage 104 includes the PMOS 118 and the PMOS 120 arranged as a differential amplifier to, for example, mitigate (e.g., cancel) common mode noise in a signal output by the gain stage 104 to the buffer stage 106 at node 178.

The output of the gain stage 104 as seen from the input to the buffer stage 106, in at least some examples, is a high impedance output. The buffer stage 106, in at least some examples, is configured to buffer a component (not shown) coupled to the output of the amplifier 100 (e.g., $V_{OUT}$) from the high impedance seen at the output of the gain stage 104. For example, the buffer stage 106 is implemented as a super source follower with a low impedance as seen at the output of the amplifier 100 (e.g., $V_{OUT}$).

Figure 2:
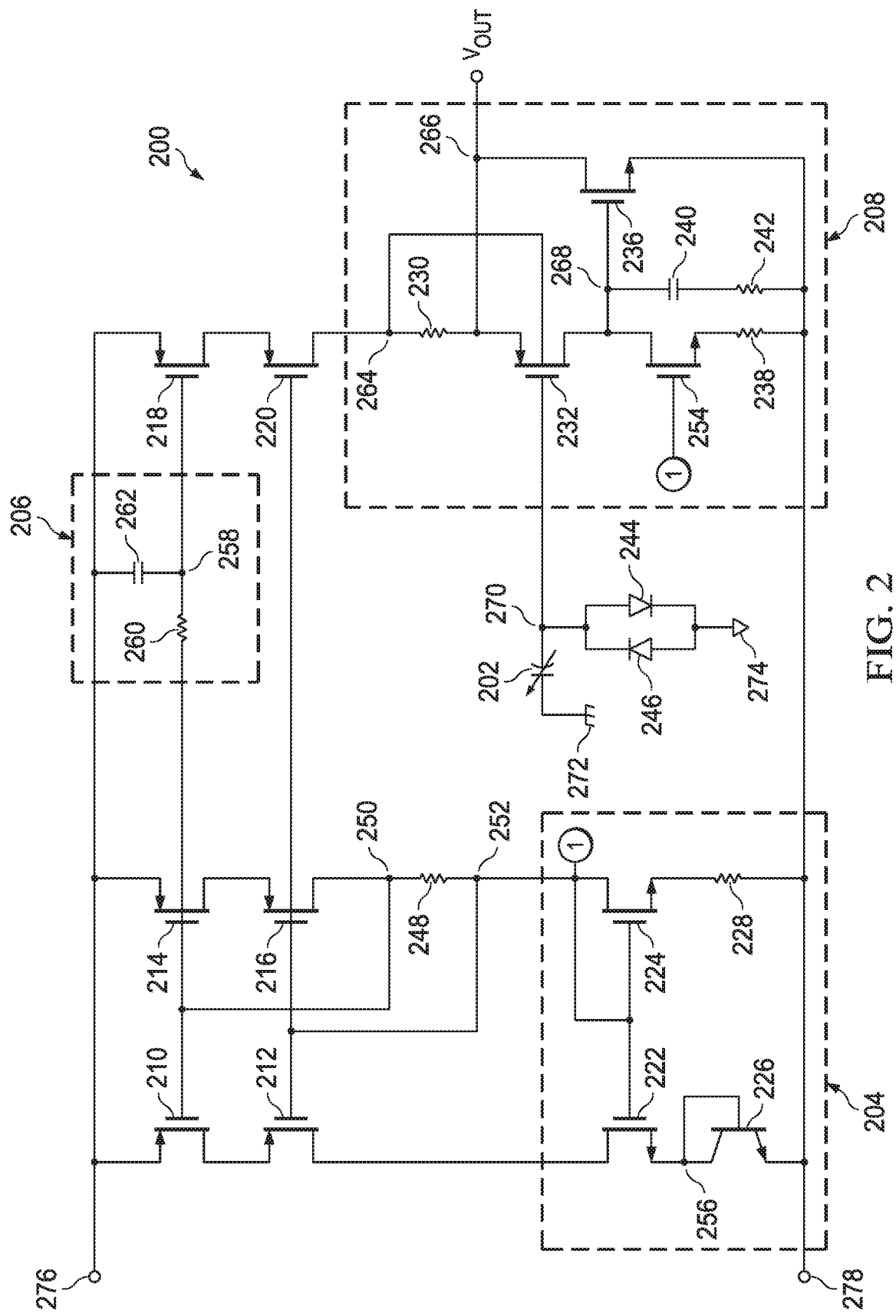
FIG. 2 shows a schematic diagram of an illustrative amplifier.

Turning now to FIG. 2, a schematic diagram of an illustrative amplifier 200 is shown. The amplifier 200 is, for example, an open-loop single-stage amplifier. For example, the amplifier 200 does not include a feedback path where an output ($V_{OUT}$) of the amplifier 200 is fed back through the amplifier 200 and is therefore referred to as open-loop. Additionally, in at least one example, the amplifier 200 includes a buffer stage 208 without including a gain stage, and is therefore referred to as single-stage. In at least one example, an amplification factor (e.g., gain) of the amplifier 200 is approximately one at least partially due to the amplifier 200 not including a gain stage. In at least one example, the amplifier 200 is suitable for implementation to amplify and/or buffer an output of a capacitance-based sensor. For example, the amplifier 200 is configured to couple to a sensor 202 and buffer an output of the sensor 202 for output by the amplifier 200 as $V_{OUT}$. The sensor 102 is any capacitance-based sensor, as discussed above. In at least one example, the sensor 202 is coupled between the amplifier 200 and a chassis ground 272 (which in some examples is coupled to an Earth ground (not shown) or node 278). In at least some examples, the amplifier 200 is further configured to couple to a controller (not shown) or other processing element that provides one or more control signals (e.g., transistor gate control signals) to the amplifier 200.

In at least one example, the amplifier 200 includes a bias circuit 204 that includes a NMOS 222, a NMOS 224, and a NPN bi-polar junction transistor (BJT) 226. In at least one example, the bias circuit 204 further includes, or is configured to couple to, a resistor 228. In at least one example, the buffer stage 208 includes a PMOS 232, a NMOS 234, and a NMOS 236. The buffer stage 208 further includes, or is configured to couple to, a resistor 238, a capacitor 240, and a resistor 242. In at least one example, the amplifier 200 further includes PMOS 210, PMOS 212, PMOS 214, PMOS 216, PMOS 218, and PMOS 220. The amplifier 200 further includes, or is configured to couple to, a resistor 248, a diode 244, a diode 246, and a filter 206. In at least one example, the filter 206 includes an impedance element 260 and a capacitor 262. The impedance element 260 is, for example, any suitable element that provides an amount of impedance (e.g., on a GΩ scale), such as a large impedance MOSFET circuit, as further described below with respect to FIG. 3.

In at least one example, the amplifier 200 is configured to receive a plurality of voltage signals. For example, the amplifier 200 receives VDD at a node 276 and VSS at a node 278. In various examples, the voltage signals are received from any one or more suitable sources such as, for example, a controller or other processing element coupled to the amplifier 200, a power source coupled to the amplifier 200, and/or a reference circuit included within, or coupled to, the amplifier 200. In at least one example, VSS represents a ground (e.g., Earth ground) such that node 278 is referred to as a ground node.

In at least one example, each of the PMOS 210, 214, and 218 are coupled at respective source terminals to the node 276. In at least one example, gate terminals of the PMOS 210 and the PMOS 214 are each coupled to a node 250, gate terminals of the PMOS 212 and 216 are each coupled to a node 252, a drain terminal of the PMOS 210 is coupled to a source terminal of the PMOS 212, and a drain terminal of the PMOS 214 is coupled to a source terminal of the PMOS 216. Further, in at least one examples, a drain terminal of the PMOS 212 is coupled to a source terminal of the NMOS 222, a drain terminal of the PMOS 216 is coupled to the node 250, a gate terminal of the PMOS 218 is coupled to a node 258, a drain terminal of the PMOS 218 is coupled to a source terminal of the PMOS 220, a gate terminal of the PMOS 220 is coupled to the node 252, and a drain terminal of the PMOS 220 is coupled to a node 264. In at least one example, a source terminal of the NMOS 222 is coupled to the node 256, a gate terminal of the NMOS 222, a gate terminal of the NMOS 224, and a drain terminal of the NMOS 224 are coupled to the node 252, and a source terminal of the NMOS 224 is coupleable to the node 278 via the resistor 228. In at least one example, a collector of the BJT 226 is coupled to the node 256, a base of the BJT 226 is coupled to the node 256, and an emitter of the BJT 226 is coupled to the node 278. In at least one example, the diodes 244 and 246 are coupled between the node 270 and a digital (or common) ground node 274 in opposite polarities with respect to each other such that a DC operating point of the amplifier 200 is set to about zero via leakage of the diode 244 and the diode 246. In at least one example, the diode 244 and the diode 246 further mitigate at least some effects of ESD. In at least one example, the amplifier 200 is configured to couple to the sensor 202 at the node 270. In at least one example, a first terminal of the impedance element 260 is coupled to the node 250, a second terminal of the impedance element 260 is coupled to the node 258, a first terminal of the capacitor 262 is coupled to the node 276, and a second terminal of the capacitor 262 is coupled to the node 258.

In at least one example, a gate terminal of the PMOS 232 is coupled to the node 270, a source terminal of the PMOS 232 is coupled to a node 266, and a drain terminal of the PMOS 232 is coupled to a node 268. In at least one example, a bulk connection of the PMOS 232 is coupled to the node 264. In at least one example, the resistor 230 is coupleable between the node 264 and the node 266. In at least one example, a gate terminal of the NMOS 234 is coupled to the node 252, a drain terminal of the NMOS 254 is coupled to the node 268, and a source terminal of the NMOS 254 is coupleable to ground though the resistor 238. In at least one example, a gate terminal of the NMOS 236 is coupled to the node 268, a drain terminal of the NMOS 236 is coupled to the node 266, and a source terminal of the NMOS 236 is coupled to the node 278. In at least one example, a first terminal of the capacitor 240 is coupled to the node 268, a second terminal of the capacitor 240 is coupled to a first terminal of the resistor 242, and a second terminal of the resistor 242 is coupled to the node 278. In at least one example, $V_{OUT}$ of the amplifier 200 is taken at node 266.

In at least one example of operation, the amplifier 200 is configured to amplify and/or buffer a signal received from the sensor 202 (e.g., such that the node 270 is referred to as an input of the amplifier 200). In at least one example, a gain of the amplifier 200 (e.g., an amount of amplification provided by the amplifier 200 to the signal received from the sensor 202) is approximately 1 such that little to no amplification is provided. The PMOS 232, in at least one example, is biased by coupling the bulk connection of the PMOS 232 to a back bias voltage present at node 264. Providing the back bias voltage to the PMOS 232, in at least some examples, increase a gate to source threshold of the PMOS 232. Increasing the gate to source threshold of the PMOS 232, for example, provides increased headroom for a swing in a voltage present at the gate terminal of the PMOS 232. For example, the headroom (or room for variation in a voltage at node 270 and received at the gate terminal of the PMOS 232) is expressed as $V_{headroom}=Vgs_{232}-Vgs_{234}$, where $Vgs_{232}$ is a gate to source voltage threshold of the PMOS 232 (e.g., as biased by the back bias voltage present at node 264) and $Vgs_{234}$ is a gate to source voltage threshold of the NMOS 234. In The headroom, for example, facilitates an output signal swing while mitigating the clipping or distortion of the output signal. The back bias is generated, for example, by a voltage drop occurring across the resistor 230 such that a voltage present at node 264 (and which is used to back bias the PMOS 232) is greater than a voltage present at node 266 (and therefore provided to the source terminal of the PMOS 232). Further, the node 264, in at least one example, tracks $V_{OUT}$ such that the back bias is independent of a signal received by the amplifier at node 270 and mitigates a potential gmb effect (e.g., having a potential to reduce a gain of the buffer 208 to less than about 1) of the back biasing. A gmb effect represents the increase in threshold voltage due to back bias (e.g., back-bias transconductance). The direction of the threshold voltage increase is in such a way that it opposes the output signal, resulting in a reduced effective gain of an amplifier (or amplifier components, such as transistors).

In at least one example, the bias circuit 204 formed by the BJT 226, the NMOS 222, the NMOS 224, and the resistor 228 operates such that a base to emitter voltage (VBE) of the BJT 226 appears across resistor 228, creating a VBE/R current, where R is a value of the resistance of the resistor 228. By mirroring the VBE of the BJT 226 across the resistor 228, a larger value of resistance of the resistor 228 is made suitable for the amplifier 200, thereby reducing an amount of signal noise associated with the bias circuit 204 (e.g., introduced into the amplifier 200 by the bias circuit 204). In some examples, the signal noise created by the bias circuit 204 (e.g., at least partially via the resistor 228) in the amplifier 200, such as at node 276, node 250, and/or node 252, is at least partially mitigated by the filter 206. For example, for an amplifier 200 implemented in an audio application (e.g., coupling at node 270 to a microphone), the filter 206 is a high-pass filter having a cutoff frequency at about 100 hertz (Hz) or any other suitable frequency that is less than the audible frequency range. The filter 206 filters the signal noise, in at least one example, from the node 250 which represents, in at least some example, a bias voltage for at least some components of the amplifier 200. To minimize the signal noise allowed to pass through the filter 206 the impedance element 260 is large in value (e.g., greater than 1 GΩ). To implement the impedance element 260, in at least some example, the amplifier includes a large impedance MOSFET circuit, as further described below with respect to FIG. 3.

Turning now to FIG. 3, a schematic diagram of an illustrative large impedance MOSFET circuit 300 is shown. In at least one example, the circuit 300 is suitable for implementation as the impedance element 260 of the amplifier 200 of FIG. 2. In another example, the circuit 300 is suitable for implementation in any electronic device implementing a large impedance value (e.g., greater than 1 GΩ). In at least one example, the circuit 300 includes a PMOS 305 and a PMOS 310. The circuit 300 further includes, or is configured to couple to, a current source 315.

In at least one example, source terminals of the PMOS 308 and the PMOS 310 are coupled to a node 302, a drain terminal of the PMOS 308 is coupled to a node 304, a gate terminal of the PMOS 308, a gate terminal of the PMOS 310, and a drain terminal of the PMOS 310 are coupled to a node 314, and the current source 312 is coupled between the node 314 and a digital (or common) ground node 316. The current source 312, in at least one example, is oriented such that current is drawn through the circuit 300 and sunk into the node 316.

In at least one example of operation, the circuit 300 is configured to provide an amount of impedance (e.g., resistance) between nodes 302 and 304 such that the circuit 300 provides similar functionality to that of a resistor. To provide the impedance, in at least one example the circuit 300 biases the PMOS 308 and the PMOS 310 to operate the PMOS 308 and the PMOS 310 in a subthreshold mode of operation. For example, both the PMOS 308 and the PMOS 310 turn on (e.g., form a channel between respective drain and source terminals through which current freely flows) when a gate terminal to source terminal voltage difference (Vgs) exceeds a threshold (e.g., the gate terminal is at a sufficiently lower potential than the source terminal). However, prior to the PMOS 308 and the PMOS 310 turning on (e.g., the Vgs exceeding the threshold) and current freely flowing between drain and source terminals, a limited amount of current (sometimes referred to as a leakage current) flows between the drain and source terminals when Vgs does not exceed the threshold (e.g., is sub-threshold). When the PMOS 308 or PMOS 310 is fully off (e.g., Vgs=0) the PMOS 308 or PMOS 310 can be said to represent infinite resistance or an open circuit between its respective drain and source terminals. Once a non-zero Vgs exists, a minimal amount of current flows between the drain and source terminals and the resistance transitions from an infinite resistance to a finite resistance of a large value (e.g., mega-ohm to GΩ). In this way, large value impedances are implemented by the circuit 300 by operating a plurality of MOSFETs in a subthreshold region. In at least one example, modifying a current of the current source 312 modifies the gate voltage of the PMOS 308 and the PMOS 310 and biases the PMOS 308 and PMOS 310 to control operation in the subthreshold region.

Turning now to FIG. 4, a schematic diagram of an amplifier 400 is shown. The amplifier 400 is, for example, a closed-loop amplifier. For example, a feedback signal based on an output of the amplifier 400 is provided to a differential amplifier within the amplifier 400, thereby creating the closed-loop architecture. In at least one example, the amplifier 400 is suitable for implementation to amplify and/or buffer an output of a capacitance-based sensor. For example, the amplifier 400 is configured to couple to a sensor (not shown) and buffer an output of the sensor for output by the amplifier 400 as $V_{OUT}$. The sensor is any capacitance-based sensor, as discussed above. In at least one example, the sensor is coupled to the amplifier 400 at node 470. In at least some examples, the amplifier 400 is further configured to couple to a controller (not shown) or other processing element that provides one or more control signals (e.g., transistor gate control signals) to the amplifier 400.

In at least one example, the amplifier 400 includes, or is configured to couple to, a bias circuit 402 and a compensation circuit (e.g., Ahuja compensation) 404. The amplifier 400 further includes a PMOS 406, a PMOS 408, a PMOS 410, a PMOS 412, a PMOS 414, and a PMOS 416. In at least some examples, the bias circuit 402 includes a resistor 418 and a resistor 420. In at least one example, the amplifier 400 further includes, or is configured to couple to, resistors 422, 430, 442, 444, and capacitor 440. In at least one example, the amplifier 400 further includes a PMOS 424, a PMOS 432, a NMOS 426, a NMOS 428, a NMOS 434, and a NMOS 436.

In at least one example, the amplifier 400 is configured to receive a plurality of voltage signals. For example, the amplifier 400 receives VDD at a node 462, VBP at a node 464, a VCASP at a node 466, a VSS at a node 468, and a VBN at node 472. In various examples, the voltage signals are received from any one or more suitable sources such as, for example, a controller or other processing element coupled to the amplifier 400, a power source coupled to the amplifier 400, and/or a reference circuit included within, or coupled to, the amplifier 400. In at least one example, VSS represents a ground (e.g., Earth ground) such that node 468 is referred to as a ground node.

In at least one example, each of the PMOS 406, 410, and 414 are coupled at respective source terminals to the node 462 and at respective gate terminals to the node 464. In at least one example, the PMOS 408, 412, and 416 are each coupled at respective gate terminals to the node 466. In at least one example, a drain terminal of the PMOS 406 is coupled to a source terminal of the PMOS 408, a drain terminal of the PMOS 410 is coupled to a source terminal of the PMOS 412, and a drain terminal of the PMOS 414 is coupled to a source terminal of the PMOS 416. In at least one example, a drain terminal of the PMOS 408 is coupled to a node 446, a drain terminal of the PMOS 412 is coupled to a node 450, and a drain terminal of the PMOS 416 is coupled to a node 454.

In at least one example, the resistor 418 is coupleable between the node 446 and a node 448 and the resistor 420 is coupleable between the node 448 and the node 468. The resistor 422 is coupleable between the node 450 and a source terminal of the PMOS 424, a gate terminal of the PMOS 424 is coupled to the node 452, a drain terminal of the PMOS 424 is coupled to a node 460, and a drain terminal of the NMOS 426 is coupled to the node 460. In at least one example, gate terminals of the NMOS 426 and the NMOS 434 are coupled to the node 472, a source terminal of the NMOS 426 is coupled to a drain terminal of the NMOS 428, a drain terminal of the NMOS 428 is coupled to the node 468, gate terminals of the NMOS 428 and 436 are coupled to the node 460, a source terminal of the NMOS 434 and a drain terminal of the NMOS 436 are coupled to a node 458, and a drain terminal of the NMOS 436 is coupled to the node 468. Additionally, the resistor 430 is coupleable between the node 450 and a source terminal of the PMOS 432, a gate terminal of the PMOS 432 is coupled to node 470, and a drain terminal of the PMOS 432 is coupled to the node 456. In at least one example, the capacitor 440 is coupleable between the node 458 and the node 454, a gate terminal of the NMOS 438 is coupled to the node 456, a drain terminal of the NMOS 438 is coupled to the node 454, and a source terminal of the NMOS 438 is coupled to the node 468. In at least one example, the resistor 442 is coupleable between the node 454 and the node 452 and the resistor 444 is coupleable between the node 452 and the node 468. In at least one example, $V_{OUT}$ of the amplifier 400 is taken at node 454.

To establish headroom for an input of the amplifier 400 to vary (e.g., as discussed above with respect to FIG. 2), the PMOS 424 and the PMOS 432 are biased by the bias circuit 402. For example, a bulk connection of the PMOS 424 is coupled to the node 448 and a bulk connection of the PMOS 424 is coupled to the node 446. In this way, the bulk connection of the PMOS 424 is tied to a higher voltage level than the bulk connection of the PMOS 432.

In at least one example of operation, the amplifier 400 is configured to amplify and buffer a signal received at node 470 (e.g., such that the node 470 is referred to as an input of the amplifier 400 and is, for example, coupled to a capacitive-based sensor). The PMOS 424 and the PMOS 432 are, in at least one example, arranged to form a differential amplifier in which the PMOS 432 is biased to a higher gate to source threshold voltage than the PMOS 424 (e.g., via the bulk connections described above) and the PMOS 424 receives scaled feedback (e.g., scaled by a voltage divider formed by the resistors 442 and 444) from an output of the amplifier 400. The biasing of the PMOS 424 and the PMOS 432, in at least one example, facilitate processing of a signal at node 470 including minimal, or no, common-mode voltage component. An output of the PMOS 432 is passed to the compensation circuit 404 which, in at least some examples, provides for a low impedance output at the node 454. In at least one example, the compensations circuit 404 provides Ahuja compensation in which the NMOS 434 operates as a ground-gate amplifier and node 458 is a virtual ground converting the capacitive current (CC) from capacitor 440 to a voltage at node 456 depending the gate to source capacitance (CGS) of the NMOS 438. In this example, a voltage gain is defined by a ratio of CC to CGS (CC/CGS). In at least one example, this increases the effective gain of the amplifier 400, thereby reducing the output impedance.

Turning now to FIG. 5, a schematic diagram of an illustrative amplifier 500 is shown. The amplifier 500 is, for example, a closed-loop amplifier. For example, a feedback signal based on an output of the amplifier 500 is provided to a differential amplifier within the amplifier 500, thereby creating the closed-loop architecture. In at least one example, the amplifier 500 is suitable for implementation to amplify and/or buffer an output of a capacitance-based sensor. For example, the amplifier 500 is configured to couple to a sensor (not shown) and buffer an output of the sensor for output by the amplifier 500 as $V_{OUT}$. The sensor is any capacitance-based sensor, as discussed above. In at least one example, the sensor is coupled to the amplifier 500 at node 558. In at least some examples, the amplifier 500 is further configured to couple to a controller (not shown) or other processing element that provides one or more control signals (e.g., transistor gate control signals) to the amplifier 500.

In at least one example, the amplifier 500 includes a PMOS 502, a PMOS 504, a PMOS 506, and a PMOS 508. In at least one example, the amplifier 500 further includes a PMOS 512, a PMOS 520, a NMOS 514, NMOS 516, NMOS 522, NMOS 524, and NMOS 530. The amplifier 500 further includes, or is configured to couple to, resistors 510 and 518. In at least some examples, the amplifier further includes, or is configured to couple to, capacitors 526, 528, 532, and 534. The capacitors 526, 532, and 534 are, for example, AFG capacitors. AFG capacitors are capacitors that are capable of being electrically programmed to a fixed voltage level (e.g., pre-charged to the fixed voltage level). The AFG capacitors are electrically programmed, in at least one example, by controlling a gate oxide breakdown of the AFG capacitors.

In at least one example, the amplifier 500 is configured to receive a plurality of voltage signals. For example, the amplifier 500 receives VDD at a node 536, VBP at a node 538, VCASP at a node 540, VBN at a node 542, and VSS at a node 544. In various examples, the voltage signals are received from any one or more suitable sources such as, for example, a controller or other processing element coupled to the amplifier 500, a power source coupled to the amplifier 500, and/or a reference circuit included within, or coupled to, the amplifier 500. In at least one example, VSS represents a ground (e.g., Earth ground) such that node 544 is referred to as a ground node.

In at least one example, source terminals of the PMOS 502 and 506 are coupled to the node 536, gate terminals of the PMOS 502 and 506 are coupled to the node 538, a drain terminal of the PMOS 502 is coupled to a source terminal of the PMOS 504, and a drain terminal of the PMOS 506 is coupled to a source terminal of the PMOS 508. Additionally, a drain terminal of the PMOS 504 is coupled to a node 546 and a drain terminal of the PMOS 508 is coupled to a node 554.

In at least one example, the resistor 510 is coupleable between the node 546 and a source terminal of the PMOS 512, a gate terminal of the PMOS 512 is coupled to the node 556, a drain terminal of the PMOS 512 is coupled to a node 548, and a drain terminal of the NMOS 514 is coupled to the node 548. In at least one example, bulk connections of the PMOS 512 and the PMOS 520 are coupled to the node 546. In at least one example, gate terminals of the NMOS 514 and the NMOS 522 are coupled to the node 542, a source terminal of the NMOS 514 is coupled to a drain terminal of the NMOS 516, a drain terminal of the NMOS 516 is coupled to the node 544, gate terminals of the NMOS 516 and 524 are coupled to the node 548, a source terminal of the NMOS 522 and a drain terminal of the NMOS 524 are coupled to a node 550, and a drain terminal of the NMOS 524 is coupled to the node 544. Additionally, the resistor 518 is coupleable between the node 546 and a source terminal of the PMOS 520, a gate terminal of the PMOS 520 is coupled to a first terminal of the capacitor 526, and a drain terminal of the PMOS 520 is coupled to the node 552. In at least one example, a second terminal of the capacitor 526 is coupleable to the node 558, the capacitor 528 is coupleable between the node 550 and the node 554, a gate terminal of the NMOS 530 is coupled to the node 552, a drain terminal of the NMOS 530 is coupled to the node 544, and a source terminal of the NMOS 530 is coupled to the node 554. In at least one example, the capacitor 532 is coupleable between the node 554 and the node 556 and the capacitor 534 is coupleable between the node 556 and the node 544. In at least one example, $V_{OUT}$ of the amplifier 500 is taken at node 554.

In at least one example of operation, the amplifier 500 is configured to amplify and buffer a signal received at node 558 (e.g., such that the node 558 is referred to as an input of the amplifier 500 and is, for example, coupled to a capacitive-based sensor). The capacitor 526 is, for example, programmed to a non-zero voltage potential. The non-zero voltage potential, for example, level shifts a signal received by the amplifier 500 at node 558 (e.g., providing a DC offset). Level shifting the signal received at node 558, in at least one example, mitigates difficulties in processing signals including minimal, or no, common-mode voltage component, as discussed above, without back biasing components of the amplifier 500 as previously described in the present disclosure with respect to various other examples. In at least one example, VDD received by the amplifier 500 is less than VDD received by other examples described in the present disclosure, for example, at least partially as a result of the lack of back biasing in the amplifier 500.

The PMOS 512 and the PMOS 520 are, in at least one example, arranged to form a differential amplifier in which the PMOS 512 receives feedback from the node 556. In at least one example, the capacitors 532 and 534 are pre-programmed with zero voltage potential such that the node 556 is a floating node held at approximately zero volts. An output of the PMOS 520 is passed to the NMOS 530 which, in at least some examples, is a component of a compensation circuit (e.g., such as an Ahuja compensation circuit, as discussed above) that provides for a low impedance output at the node 554.

Turning now to FIG. 6, a schematic diagram of an illustrative bias generation circuit 600 is shown. In at least one example, the circuit 600 is suitable for implementation according to any example of the present disclosure to generate a bias voltage. In at least one example, the circuit 600 includes a PMOS 602, a PMOS 604, a PMOS 606, a PMOS 608, a NMOS 612, and a NMOS 616. In at least one example, the circuit 600 further includes, or is configured to couple to, a resistor 610, a capacitor 614, and a resistor 618. The capacitor 614 is, for example, an AFG capacitor.

In at least one example, the circuit 600 is configured to receive a plurality of voltage signals. For example, the circuit 600 receives VDD at a node 626, VBP at a node 630, VCASP at a node 632, and VSS at a node 628. In various examples, the voltage signals are received from any one or more suitable sources such as, for example, a controller or other processing element coupled to the circuit 600, a power source coupled to the circuit 600, and/or a reference circuit included within, or coupled to, the circuit 600. In at least one example, VSS represents a ground (e.g., Earth ground) such that node 628 is referred to as a ground node.

In some examples, source terminals of the PMOS 602 and 606 are coupled to the node 626, gate terminals of the PMOS 602 and 606 are coupled to the node 630, a drain terminal of the PMOS 602 is coupled to a source terminal of the PMOS 604, a drain terminal of the PMOS 606 is coupled to a source terminal of the PMOS 608, gate terminals of the PMOS 604 and 608 are coupled to the node 632, and a drain terminal of the PMOS 608 is coupled to the node 630. In at least one example, the resistor 610 is coupleable between the node 630 and the node 632. Further, in an example a drain terminal of the PMOS 604 is coupled to the node 620, a gate terminal of the NMOS 612 and a first terminal of the capacitor 614 are coupled to the node 620, a drain terminal of the NMOS 612 is coupled to the node 628, a second terminal of the capacitor 614 is coupled to a gate terminal of the NMOS 616, a drain terminal of the NMOS 616 is coupled to the node 632, and the resistor 618 is coupleable between a source terminal of the NMOS 616 and the node 628. In at least one example, the circuit 600 provides bias voltages at nodes 630 and 632 (e.g., such that, in one example, nodes 630 and 632 of FIG. 6 are suitable to couple to nodes 538 and 540, respectively, of the amplifier 500 of FIG. 5 to provide bias voltages to the amplifier 500 of FIG. 5).

In at least one example of operation of the circuit 600, a non-zero voltage potential is pre-programmed on the capacitor 614. In some examples, the non-zero voltage potential is less than a gate to source voltage threshold of the NMOS 616. The voltage programmed to the capacitor 614, in some examples, establishes a voltage differential across the resistor 618 such that the bias voltage generated by the circuit 600 is approximately equal to the voltage programmed to the capacitor 614. For example, a voltage across the resistor 618 represents the difference between the gate voltages of the NMOS 612 and the gate voltage of the NMOS 616, plus the voltage across the capacitor 614. Since the NMOS 612 and the NMOS 616 are substantially identical, the voltage across the capacitor 614 appears across the resistor 618 (e.g., according to the source follower operation of the NMOS 616). In at least some examples, the bias voltage generated by the circuit 600 contains minimal, to no, signal noise component.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. A device that is "configured to" perform a task or function may be configured (e.g., programmed and/or hard-wired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An amplifier, comprising:
   a bias circuit configured to generate a bias voltage with respect to ground; and
   an open-loop gain stage comprising:
      a first p-type metal oxide semiconductor field effect transistor (MOSFET) (PMOS) having a gate terminal coupled to a first node, a source terminal coupled to a second node, a drain terminal coupled to a third node, and a bulk connection coupled to the bias circuit;
      a second PMOS having a gate terminal coupled to a ground node, a source terminal coupled to the second node, a drain terminal coupled to a fourth node, and a bulk connection coupled to the bias circuit;
      a first n-type MOSFET (NMOS) having a drain terminal and a gate terminal coupled to the third node and a source terminal coupled to a fifth node;
      a second NMOS having a drain terminal coupled to the fourth node, a gate terminal coupled to the third node; and a source terminal coupled to the fifth node, wherein the gain stage is configured to couple to an adjustable resistor positioned between the third node and the fourth node; and
   a buffer stage coupled to the open-loop gain stage at the fourth node and comprising a super source follower.

2. The amplifier of claim 1, further comprising a first diode and a second diode coupled in opposing polarities between the first node and the ground node, wherein the first node is an input of the amplifier.

3. The amplifier of claim 1, wherein the bias circuit comprises a third NMOS having a drain terminal and a gate terminal coupled to the buffer stage and a source terminal configured to couple to the fifth node via a first resistor, wherein the bias circuit is further configured to couple to a second resistor and a first capacitor, each positioned between a sixth node and the fifth node, and wherein the sixth node is coupled to the bulk connection of the first PMOS and the second PMOS.

4. The amplifier of claim 1, wherein the buffer stage comprises:
   a third PMOS having a gate terminal coupled to the fourth node, a source terminal coupled to a seventh node, and a drain terminal coupled to an eighth node;

a fourth NMOS having a gate terminal coupled to the bias circuit, a source terminal configured to couple to the fifth node via a third resistor, and a drain terminal coupled to the eighth node; and a fifth NMOS having a gate terminal coupled to the eighth node, a drain terminal coupled to the seventh node, and a source terminal coupled to the fifth node, wherein the buffer stage is configured to couple to a second capacitor and a fourth resistor coupled in series between the eighth node and the fifth node, and wherein the seventh node is an output of the amplifier.

5. The amplifier of claim 1, wherein the open-loop gain stage is further configured to couple to a fifth resistor between the source terminal of the first PMOS and the second node and a sixth resistor between the source terminal of the second PMOS and the second node.

6. An integrated circuit comprising:
an input node;
an output node;
a gain stage coupled to the input node, wherein the gain stage includes:
  a first transistor that includes a gate coupled to the input node, a source coupled to a second node, and a drain coupled to a third node;
  a second transistor that includes a gate coupled to a ground node, a source coupled to the second node, and a drain coupled to a fourth node;
  a third transistor that includes a gate coupled to the third node, a drain coupled to the third node, and a source coupled to the ground node; and
  a fourth transistor that includes a gate coupled to the third node, a drain coupled to the fourth node, and a source coupled to the ground node;
a bias circuit coupled to a bulk connection of the first transistor and to a bulk connection of the second transistor; and
a buffer stage coupled to the fourth node of the gain stage, wherein the buffer stage includes:
  a fifth transistor that includes a gate coupled to the fourth node, a source coupled to the output node, and a drain coupled to a seventh node; and
  a sixth transistor that includes a gate coupled to the bias circuit, a source coupled to the ground node, and a drain coupled to the seventh node.

7. The integrated circuit of claim 6, wherein the bias circuit includes a fifth node coupled to the gate of the sixth transistor of the buffer stage and a sixth node coupled to the bulk connection of the first transistor and to the bulk connection of the second transistor.

8. The integrated circuit of claim 7, wherein the bias circuit includes a fifth transistor that includes a gate coupled to the fifth node, a source coupled to the ground node by a first resistor, and a drain coupled to the fifth node.

9. The integrated circuit of claim 8, wherein the bias circuit further includes a second resistor and capacitor coupled in parallel between the ground node and the sixth node.

10. The integrated circuit of claim 6, wherein the buffer stage further includes:
a seventh transistor that includes a gate coupled to the seventh node, a source coupled to the ground node, and a drain coupled to the output node.

11. The integrated circuit of claim 10, wherein the buffer stage further includes a capacitor and a resistor coupled in series between the seventh node and the ground node.

12. The integrated circuit of claim 6, wherein the gain stage further includes a first diode and a second diode coupled in opposing polarities between the input node and the ground node.

13. The integrated circuit of claim 6, wherein the buffer stage is a source follower buffer stage.

14. The integrated circuit of claim 6, wherein the gain stage further includes an impedance element coupled between the third node and the fourth node.

15. The integrated circuit of claim 14, wherein the impedance element coupled between the third node and the fourth node is a variable impedance element.

16. An integrated circuit comprising:
a capacitive sensor; and
an amplifier circuit coupled to the capacitive sensor, wherein the amplifier circuit includes:
  a gain stage that includes:
    a first p-type transistor having a gate terminal coupled to an input node to which the capacitive sensor is coupled, a source terminal coupled to a second node by a first resistor, and a drain terminal coupled to a third node;
    a second p-type transistor having a gate terminal coupled to a ground node, a source terminal coupled to the second node by a second resistor, and a drain terminal coupled to a fourth node;
    a first n-type transistor having a gate terminal coupled to the third node, a source terminal coupled to the ground node, and a drain terminal coupled to the third node;
    a second n-type transistor having a gate terminal coupled to the third node, a source terminal coupled to the ground node, and a drain terminal coupled to the fourth node; and
    an impedance element coupled between the third node and the fourth node;
  a buffer stage coupled to the fourth node; and
  a bias circuit coupled to a bulk of the first p-type transistor and to a bulk of the second p-type transistor.

17. The integrated circuit of claim 16, wherein the amplifier circuit further includes an output node and wherein the buffer stage includes:
a third p-type transistor that includes a gate terminal coupled to the fourth node, a source terminal coupled to the output node, and a drain terminal coupled to a fifth node; and
a third n-type transistor that includes a gate terminal coupled to the buffer stage, a source terminal coupled to the ground node, and a drain terminal coupled to the fifth node.

18. The integrated circuit of claim 17, wherein the buffer stage further includes:
a fourth n-type transistor that includes a gate terminal coupled to the fifth node, a source terminal coupled to the ground node, and a drain terminal coupled to the output node.

19. The integrated circuit of claim 18, wherein the buffer stage further includes a capacitor and a resistor coupled in series between the fifth node and the ground node.

20. The integrated circuit of claim 16, wherein the gain stage further includes a first diode and a second diode coupled in opposing polarities between the input node and the ground node.

* * * * *